(12) United States Patent
Stickney

(10) Patent No.: US 6,713,672 B1
(45) Date of Patent: Mar. 30, 2004

(54) COMPLIANT SHAPED EMI SHIELD

(75) Inventor: William Stickney, Cresco, PA (US)

(73) Assignee: Laird Technologies, Inc., Delaware Water Gap, PA (US)

( * ) Notice: Subject to any disclaimer, the term of this patent is extended or adjusted under 35 U.S.C. 154(b) by 0 days.

(21) Appl. No.: 10/314,456

(22) Filed: Dec. 6, 2002

Related U.S. Application Data

(60) Provisional application No. 60/340,397, filed on Dec. 7, 2001.

(51) Int. Cl.$^7$ ................................................. H05K 9/00
(52) U.S. Cl. ........................... 174/35 GC; 174/65 R; 439/609; 439/927
(58) Field of Search ..................... 174/35 GC, 35 C, 174/35 R, 65 R, 52.1; 361/816, 818; 439/607, 608, 609, 610, 927, 939

(56) References Cited

U.S. PATENT DOCUMENTS

| | | | | |
|---|---|---|---|---|
| 4,148,543 A | * | 4/1979 | Shores | 439/608 |
| 5,511,798 A | * | 4/1996 | Kawamoto et al. | 277/647 |
| 6,101,711 A | * | 8/2000 | Kobayashi | 29/854 |
| 6,158,899 A | * | 12/2000 | Arp et al. | 385/53 |
| 6,162,989 A | * | 12/2000 | Garner | 174/35 R |
| 6,469,244 B1 | * | 10/2002 | Harrison et al. | 174/35 R |

\* cited by examiner

*Primary Examiner*—Dean A. Reichard
*Assistant Examiner*—Carmelo Oliva
(74) *Attorney, Agent, or Firm*—Testa, Hurwitz & Thibeault, LLP

(57) ABSTRACT

Disclosed are devices for shielding one or more connection ports from electromagnetic interference emissions. In one embodiment, the device includes a conformal member having a proximal aperture, a distal aperture, and a channel extending therethrough. The distal aperture has a maximum cross-sectional dimension that is less than about one half of a cutoff wavelength, thereby forming a waveguide for attenuating EMI signals that have a wavelength greater than a predetermined cutoff wavelength. In another embodiment, the conformable member includes first conformable element and a second conformable element. The conformable elements, when mated, form a proximal aperture, a distal aperture, and a channel extending therethrough having substantially the dimensional characteristics described above.

29 Claims, 15 Drawing Sheets

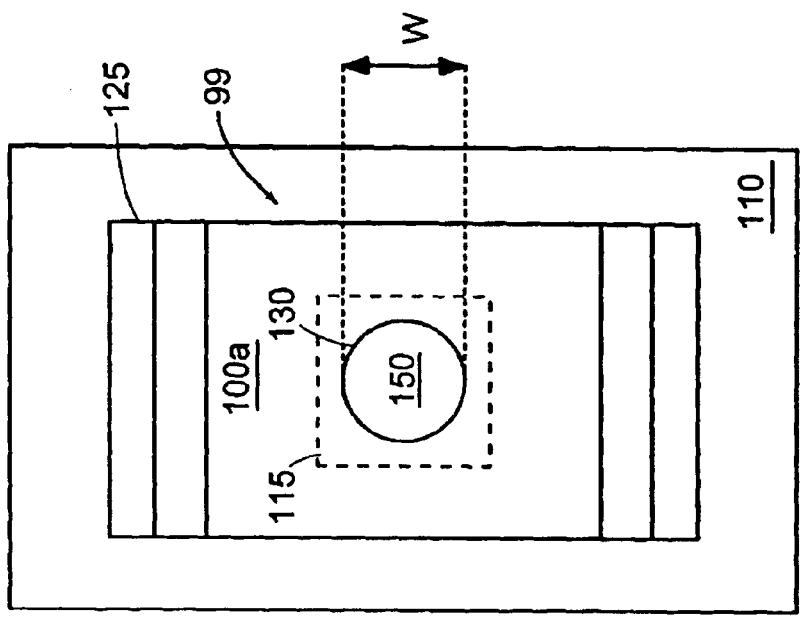
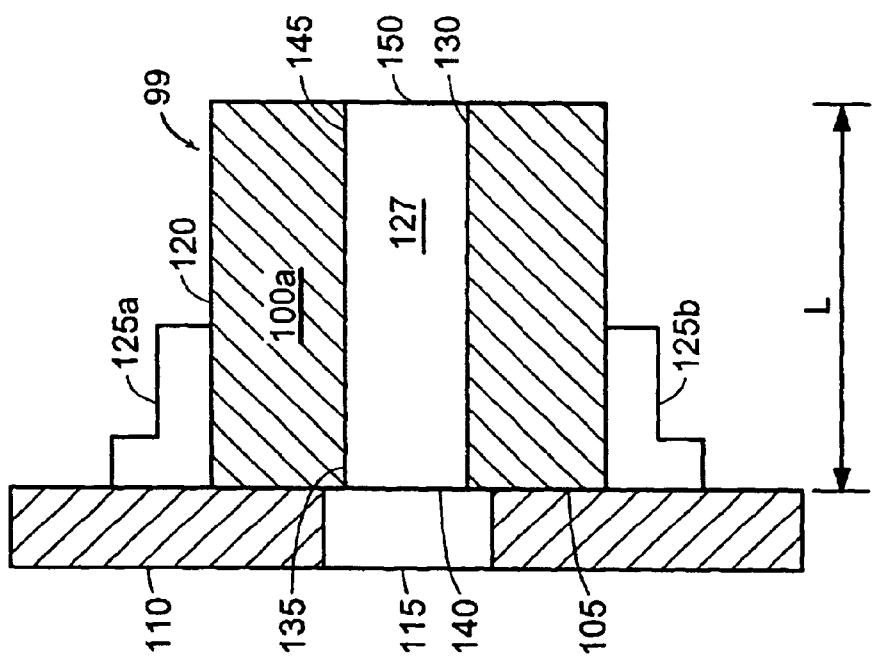

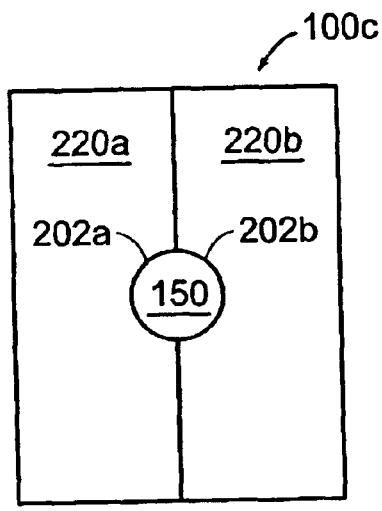
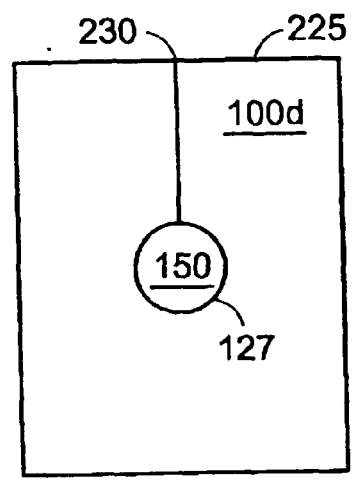
FIG. 4A
FIG. 4B
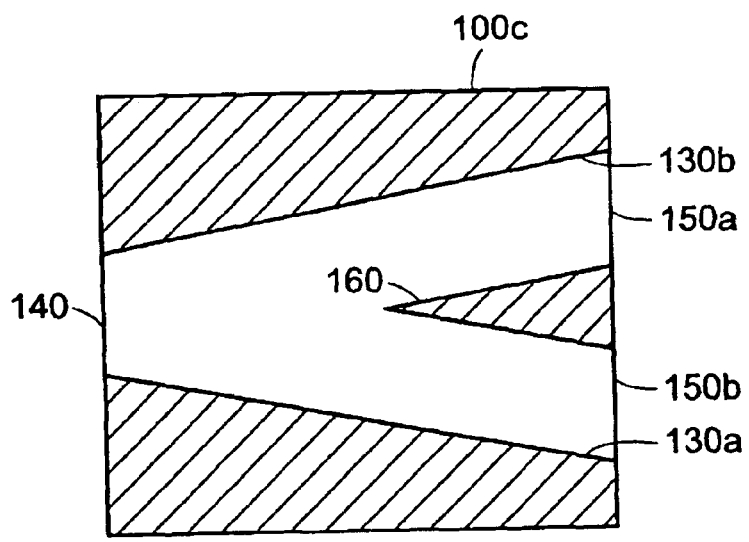
FIG. 5

COMPLIANT SHAPED EMI SHIELD

CROSS REFERENCE TO RELATED APPLICATION

This application claims priority to U.S. Provisional Patent Application Ser. No. 60/340,397, filed on Dec. 7, 2001, the disclosure of which is incorporated herein by reference in its entirety.

FIELD OF THE INVENTION

This invention relates generally to electromagnetic interference ("EMI") shielding and, more specifically, to shielding cable connection ports from the transference of EMI therethrough.

BACKGROUND OF THE INVENTION

As used herein, the term EMI should be considered to refer generally to both EMI and radio frequency interference ("RFI") emissions, and the term electromagnetic should be considered to refer generally to electromagnetic and radio frequency.

During normal operation, electronic equipment generates undesirable electromagnetic energy that can interfere with the operation of proximately located electronic equipment due to EMI transmission by radiation and/or conduction. The electromagnetic energy can be of a wide range of wavelengths and frequencies. To minimize the problems associated with EMI, sources of undesirable electromagnetic energy may be shielded and/or electrically grounded. Shielding is designed to prevent both the ingress and egress of electromagnetic energy relative to a housing or other enclosure in which the electronic equipment is disposed. Since such enclosures often include vent panels and gaps or seams between adjacent access panels, around doors, and at cable connection ports, effective shielding is difficult to attain, because the gaps in the enclosure permit the transference of EMI therethrough. Further, in the case of electrically conductive metal enclosures, these gaps can inhibit the beneficial Faraday Cage Effect by forming discontinuities in the conductivity of the enclosure which compromise the efficiency of the ground conduction path through the enclosure. Moreover, by presenting an electrical conductivity level at the gaps that is significantly different from that of the enclosure generally, the gaps can act as slot antennae, resulting in the enclosure itself becoming a secondary source of EMI.

Specialized EMI gaskets have been developed for use in shielding small gaps in electronic enclosures. These include, but are not limited to, metal spring fingers, wire mesh, fabric-over-foam, and conductive elastomers. To shield EMI effectively, the gasket should be capable of absorbing or reflecting EMI as well as establishing a continuous electrically conductive path across the gap in which the gasket is disposed.

One particularly challenging shielding issue on electronic enclosures is cable connection ports. In most instances, an electronic circuit disposed within an EMI shield requires interconnections with one or more external sources and/or destinations. Consequently, the shield provides interface ports, such as cable connection ports, to allow communication therethrough. Exemplary interfaces include power leads and signal cables. To maintain the integrity of a shield, prior art solutions use shielded cable. A shielded cable generally includes one or more signal and/or power leads substantially surrounded by a conductive jacket. Ideally, the conductive jacket is in electrical communication with the shield, thereby becoming an extension of the shield to the remote source/destination. Depending on a desired level of shielding effectiveness, and the wavelengths of the EMI, the conductive jacket may be one or more electrically conductive braids, an electrically conductive foil, and even an electrically conductive conduit (i.e., a pipe).

Some applications, however, require that a shielded electronic circuit be electrically isolated from its interfacing source/destination. Conductive shields generally preclude such electrical isolation, as they are often used to extend one electrically conductive boundary to another. One solution allowing such electrical isolation is an optical interface, such as a fiber optic interface. It is common for networked computers and other electronic devices to have multiple optic-to-electric transceivers and other electronic devices attached to circuit boards. Typically, non-conductive, plastic bulkhead connectors attach fiber optic cables to a circuit module containing a circuit board having at least one optic-to-electric interface.

Referring to FIG. 1, shown is a representative portion of a circuit module 45 connected to a fiber optic cable 50 within a networked computer system. The portion of the circuit module shown in FIG. 1 includes a circuit board 55 attached to a fiber optic device, such as a high-speed fiber optic transceiver 60, and a fiber optic pigtail 65. A fiber optic cable 50 external to the circuit module 45 connects to the fiber optic pigtail 65 through an aperture 70 in a faceplate or bezel 75. Typically, a non-conductive, plastic bulkhead connector 80 extends through the faceplate 75 to connect one end of the fiber optic cable 50 to the fiber optic pigtail 65. One or more EMI gaskets 85 are provided between the faceplate and adjacent modules.

Generally, circuit modules have multiple bulkhead connectors to service multiple fiber-optic cables representing multiple channels. Each bulkhead connector requires a mounting aperture, or hole, typically on the order of 0.5 inches square in the faceplate 75 covering the circuit module 45. Unfortunately, these holes are large enough to pass considerable EMI through the shielding barrier formed by a row of faceplates.

One prior art solution to limit the amount of interference passed to the transceivers is to have the fiber optic cables pass through a set of compliant compression flanges that sandwich the cables. See, for example, shielding devices described in U.S. Pat. No. 6,162,989, entitled "Cable Entry Shield (EMI-RFI) for Electronic Units" issued to Garner, the disclosure of which is herein incorporated by reference in its entirety. Another proposed solution is to have cables pass through slits in an electrically conductive cloth. See for example, a shielding device described in U.S. Pat. No. 6,101,711 "Method for Reducing Electromagnetic Waves Radiated from Electronic Device" issued to Kobayashi, the disclosure of which is herein incorporated by reference in its entirety.

One problem with the shielding devices described in these patents is that these devices do not sufficiently shield the openings around bulkhead connectors, especially bulkhead connectors with varying dimensions. Additionally, gaps around the cables may still transmit emissions, which are then passed to sensitive circuitry. These gaps that may have proved effective in the past are becoming unacceptable in view of the trends in electronic circuits to operate at higher speeds and greater sensitivities.

Another prior art solution to limiting the amount of interference passed to the transceivers is to externally cover the bulkhead connectors within an externally mounted shielding device (i.e., a "boot"). See, for example, externally mounted shielding devices described in U.S. Pat. No. 6,158, 899, entitled "Method and Apparatus for Alleviating ESD Induced EMI Radiating from I/O Connector Apertures" issued to Arp et al., the disclosure of which is herein incorporated by reference in its entirety.

One of the problems with the externally mounted shielding devices described in Arp et al., is that these devices are too cumbersome and take up too much space to enclose and shield all of the cables in a networked computer system.

SUMMARY OF THE INVENTION

Accordingly, it is an object of the invention to provide a compact, EMI shielded interface, such as a cable connection port or access hole, for attenuating the transference of EMI therethrough over a wide range of frequencies (e.g., above $10^9$ Hz).

In one aspect, the invention relates generally to a device for reducing transference of EMI across a conductive boundary defining an aperture in a structure, such as an equipment enclosure or faceplate. The device includes a conformable member having a conductive external surface extending along at least a portion thereof. The conductive external surface is in electrical communication with the conductive boundary. The conformable member also defines a first conductive channel of a predetermined minimum length extending therethrough. The first conductive channel is in electrical communication with the conductive external surface and is adapted for receiving at least a portion of a cable assembly. The first conductive channel has a proximal end having a first aperture and a distal end having a second aperture. The second aperture has a predetermined maximum cross-sectional dimension, such as a diameter, that is less than about one half of a predetermined cut-off wavelength. An attenuation relating to the transfer of EMI through the second aperture is determinable according to the maximum cross-sectional dimension and the minimum length.

In one embodiment the first conductive channel is a bore. In another embodiment the first conductive channel is a groove. In yet another embodiment, the first conductive channel includes a groove and a conductive member, the conductive member and the groove forming, when mated, a bore.

In one embodiment, the conformable member includes a first conformable element and a second conformable element. When mated, the first and second conformable elements form a conductive bore extending therethrough.

In some embodiments, the conformable member includes conductive flexible polymeric material or a conductively coated flexible polymeric material. In other embodiments, the conformable member further defines a second conductive channel, also adapted for receiving a portion of a cable assembly. The second conductive channel includes a third aperture at a proximal end and a fourth aperture at a distal end. As with the second aperture, the fourth aperture has a predetermined maximum cross-sectional dimension less than about one half of a predetermined cut-off wavelength. In one embodiment, the first aperture and the third aperture are the same, common aperture.

In some embodiments, the conductive member is disposed on a first side of the aperture defined by the conductive boundary. In other embodiments, at least a portion of the conductive member extends through the aperture. In still further embodiments, the proximal end of the conformable element is adapted to conform to an angled surface.

In some embodiments, the distal end portion of the channel has a length at least as great as the maximum cross-sectional dimension thereof for attenuating EMI signals. In one embodiment, the distal portion of the channel has a length at least two times greater than the maximum cross-sectional dimension of the aperture.

In another aspect, the invention relates to a process for reducing a transfer of EMI across a conductive boundary defining an aperture in a structure, such as an equipment enclosure. In one embodiment, the process includes providing a device as described above for reducing the transference of EMI across the conductive boundary defining the aperture. In another embodiment, the process includes adapting the conformable member to mate with a portion of a circuit board or other proximate structure.

In another embodiment, the process includes adapting the conductive member to function as a grommet, at least a portion of the conductive member extending through the aperture defined by the conductive boundary. In yet another embodiment, the process includes adapting the proximal end of the conformable element to conform to an angled surface.

In yet another aspect, the invention relates to a device for shielding EMI, whereby the device includes a conductive element forming an aperture. The aperture is adapted to receive a cable. In one embodiment, the conductive element includes a first end having a conductive gasket adapted to contact a support structure and a second end including a conductive gasket adapted to contact a circuit board. The conductive element also includes a conformable element positioned partially within the aperture and adapted to receive the cable. The conformable element forms a channel extending therethrough, forming a waveguide having an aperture with a maximum cross-sectional dimension less than about one half of a cut-off wavelength. The waveguide attenuates EMI signals having a wavelength greater than the cut-off wavelength.

BRIEF DESCRIPTION OF THE DRAWINGS

The above and further advantages of this invention may be better understood by referring to the following description, taken in conjunction with the accompanying drawings, in which:

FIG. 2A is a cross-sectional side view of one embodiment of the invention;

FIG. 2B is a top view of the embodiment of the invention illustrated in FIG. 2A;

FIGS. 4A and 4B are alternative embodiments of the conductive member illustrated in FIGS. 2A and 2B;

FIG. 5 is a cross-sectional view of an embodiment of the invention having two channels extending therethrough, each channel sharing a common aperture at the proximal end;

DETAILED DESCRIPTION OF THE INVENTION

Figure 1:
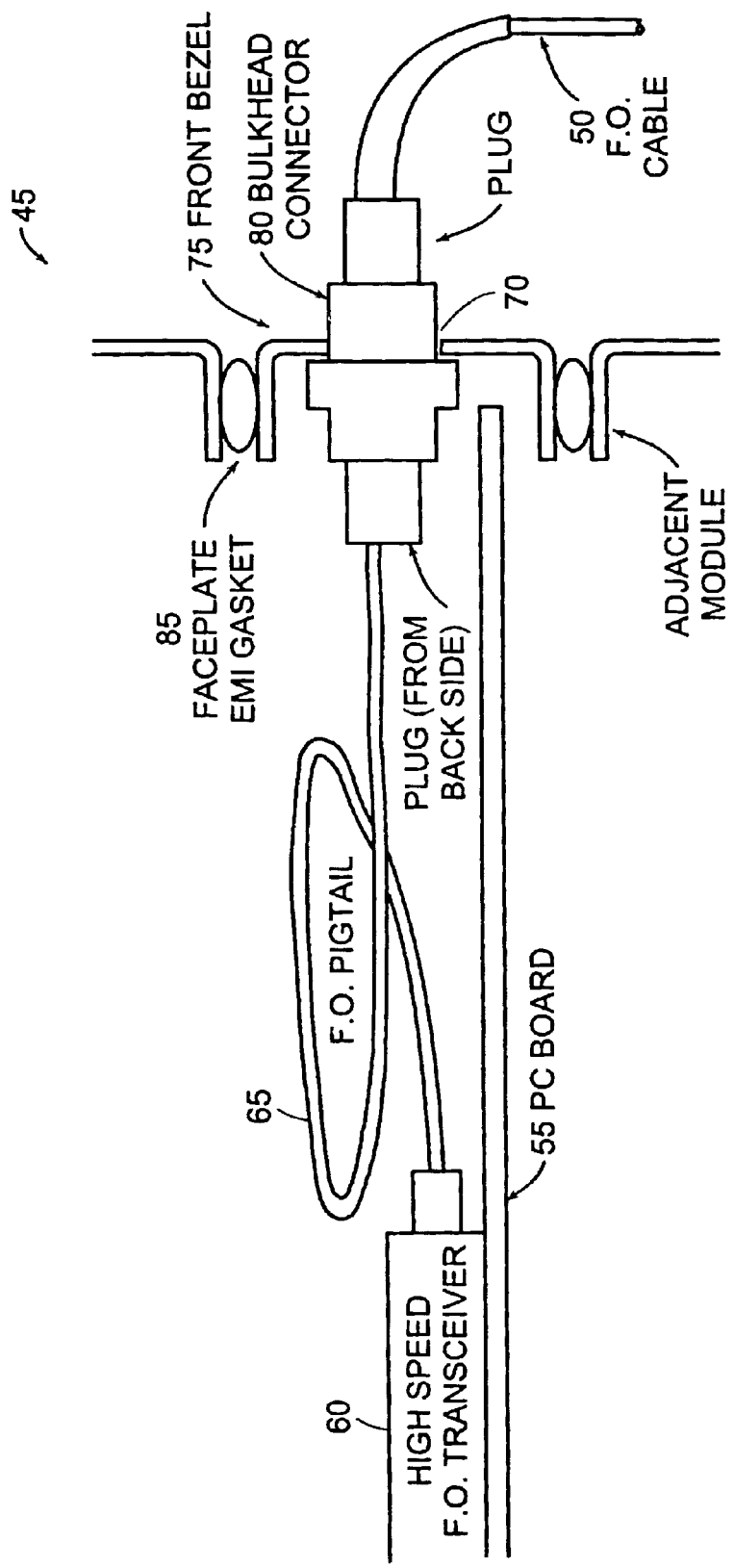
FIG. 1 is a side view of a circuit module attached to a fiber optic cable.

There exists a need, especially in telecommunication and networking equipment, to shield fiber optic port connections from electromagnetic interference (EMI) emissions. Fiber optic connectors are used in high volume in all types of telecommunication and networking equipment hardware. EMI radiates through apertures, such as a fiber optic cable connection ports, and can pass high frequency signals that can interfere with the operation of sensitive electronic components located within the telecommunication and networking equipment hardware. This invention provides a reliable, cost-effective approach to shielding one or more fiber optic connection ports or bulkhead connectors.

Referring to FIG. 2A, shown is a cross-sectional view of a shielding device 99 or plug, in accordance with one embodiment of the invention. The shielding device 99 includes a conformable member 100a having at least a portion of its surface area including a conductive external surface 105. As illustrated, the conductive external surface 105 is in electrical communication with a conductive boundary 110. The conductive boundary 110 can be an equipment enclosure, such as a metallic EMT housing or any portion thereof, such as a faceplate. The conductive boundary 110 defines an aperture 115 through which at least a portion of a fiber optic cable assembly can pass. For example, the aperture 115 can be a hole dimensioned to accommodate a fiber optic connection, such as a bulkhead connector.

In general, the conformable member 100a includes a conductive flexible polymeric material such as neoprene, silicone, or polyurethane, impregnated with a conductive material. The conductive material can include conducting particles, in the form of granules, flakes, strands, fibers, and combinations thereof. In some embodiments, the conductive particles include copper, nickel, graphite, iron, gold, palladium, silver, silver plated copper, silver plated glass, and combinations thereof.

In other embodiments, the conformable member 100a includes a core of flexible polymeric material coated with an electrically conductive layer. The electrically conductive layer can include any of the electrical conductors just described. The conductive layer can be fashioned as a wire mesh, a plating (e.g., paint, physical deposition, electroplate, etc.), a polymeric system including a coating layer of conductive polymeric material, and combinations thereof. In general, the flexible polymeric material can be an elastomer, a plastic or thermoplastic elastomer, in either a solid or a foam state, and combinations thereof.

The aperture 115 functions as a high-pass filter, selectively passing radiated signal components having wavelengths below a cutoff wavelength and substantially rejecting the passage of radiated signal components having wavelengths above the cutoff wavelength. The cutoff wavelength is a function of the dimensions of the aperture 115, and typically depends on the largest dimension of the aperture 115. The cutoff wavelength is approximately twice the largest aperture dimension.

In some embodiments, the shielding device 99 includes a proximal end 120 that is adapted to contact a support element 125 that can be used to secure the shielding device 99 to the conductive boundary 110. The support element 125 can include one or more brackets, such as L-channel brackets 125a, 125b, generally 125. The L-channel brackets 125 can be each fixedly attached to a first side of the conductive boundary 110, for example by welding, soldering, or mechanical fastener. The proximal end 120 of the shielding device 99 can be sized to fit snugly between the L-channel brackets 125, with a slight interference fit, such that the conformable member 100a can be reliably maintained against the conductive boundary 110. In another embodiment, the bracket can be a U-channel bracket (not shown), adapted for attachment to the conductive boundary 110 along the outer portion of the trough of the U. The proximal end 120 of the shielding device 99 can be similarly be sized to fit snugly in the U-channel bracket.

The conformable member 100a further defines a channel 127 extending therethrough. The channel 127 is generally adapted for receiving at least a portion of a cable assembly. For example, the channel 127 can be sized and/or shaped to accommodate a fiber optic connector and "pigtail." The channel 127 is illustrated in cross-section as a rectangle, having a predetermined minimum length "L." In general, the channel 127 can have any cross-sectional shape that extends through the conformable member 99 (e.g., tapered, multiple diameters, arcuate, and combinations thereof) as long as the channel 127 provides a predetermined cutoff wavelength. The channel also preferably includes a conductive surface 130 that is in electrical communication with the conductive external surface 105.

In more detail, the conductive channel 127 includes a proximal end 135 forming a first aperture 140 and a distal end 145 forming a second aperture 150. Referring to FIG. 2B, a top view of one embodiment of the shielding device 99 is illustrated. The second aperture 150 can be circular as shown or, in general, any shape, such as elliptical, square, rectangular, triangular, trapezoidal, rhomboidal, etc, and need not be the same shape as the first aperture. 140. Thus, the channel 127 is a bore having either a substantially constant or a varying cross-section that extends for a length L, completely through the conformable member 100a.

Figure 3B:
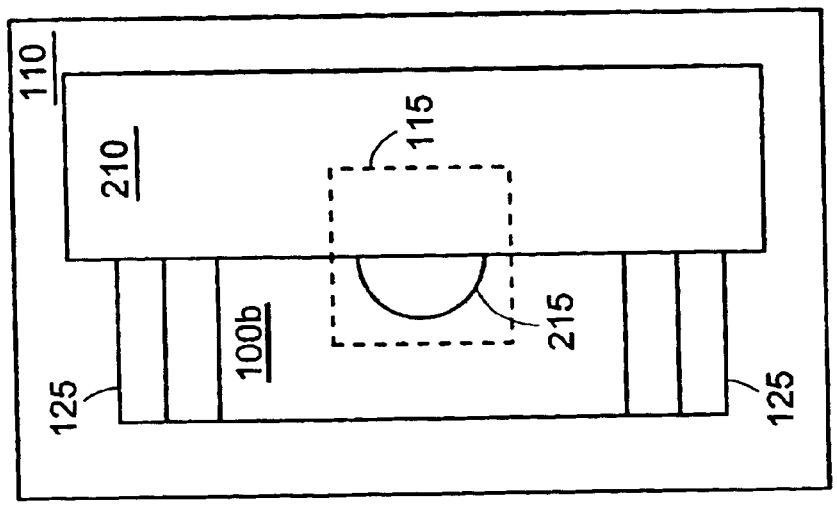
FIG. 3B is a top view of the embodiment of the invention illustrated in FIG. 3A.
Figure 3A:
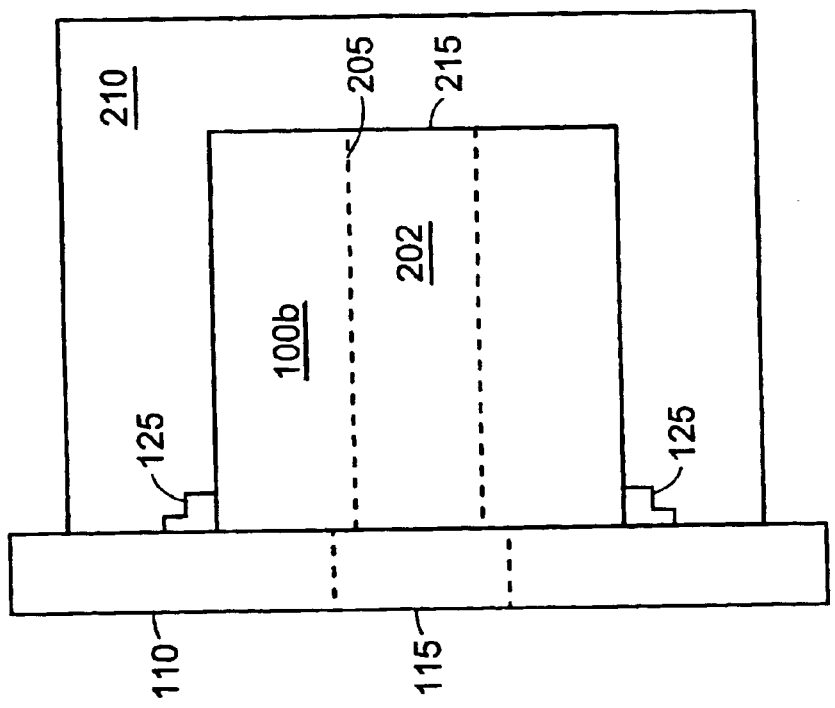
FIG. 3A is a side view of an alternative embodiment of the invention.

Referring to FIG. 3A, a side view of an alternative embodiment of a shielding device 99' is illustrated. The shielding device 99' can include a conformable member 100b defining a grooved channel 202 having a conductive surface 205. The conformable member 100b can then be mated with a conductive member 210, such as a generally planar sheet, such that the grooved channel 202 and a mating side of the conductive member 210 form a bore extending substantially through the length L of the conductive member 100b. As illustrated in FIG. 3B, a top view of the shielding device 99' reveals a cross-sectional shape of the grooved channel 202. The cross-sectional shape can be semi-circular, as illustrated, or any general two-dimensional shape adapted for receiving at least a portion of a cable assembly.

FIGS. 4A–4B illustrate a top view of other alternative embodiments of a conformable member 100. FIG. 4A illustrates an embodiment in which a conformable member 100c includes a first conformable element 220a and a second conformable element 220b. Each of the conformable elements 220a, 220b includes a respective grooved channel 202a, 202b. When mated along the surfaces defining the grooves 202a, 202b, the two conformable elements 220a, 220b define a bore. The bore has, at a distal end, a second aperture 150. The two conformable elements 220a, 220b can be fastened together using a mechanical fastening means, such as a compression fit provided by the support elements 125. Alternatively, or additionally, the two conformable elements 220a, 220b can be fastened together using a chemical fastening means, such as a glue. The glue can be a pressure sensitive glue, or a fixed setting glue, such as epoxy. The glue can also be electrically conductive. The grooved channels 202a, and 202b can include an electrically conductive surface that is in electrical communication with an external surface adapted for interconnection to a conductive boundary.

FIG. 4B illustrates an alternative embodiment of a conformable member 100d, in which the conformable member 100d defines an interior channel 127, such as a bore, adapted for housing at least a portion of a fiber optic cable assembly. The conformable member 100d includes a longitudinal slit 230 extending from an external side surface 225 to the interior channel 127d, along substantially the entire length of the interior channel 127d. The slit 230 generally follows the longitudinal axis of the channel 127 and allows for the insertion of at least a portion of a cable assembly into the channel 127.

Referring to FIG. 5, shown is one embodiment of a shielding device 99 adapted for receiving at least a portion of a duplex cable assembly. The shielding device 99 includes a conformable member 100e defining a first channel 130a extending along substantially the entire length of the conformable member 100e. The conformable member 100e also defines a second channel 130b, extending along substantially the entire length of the conformable member 100e that intersects with the first channel 130a, typically at an acute angle.

As illustrated, the first channel 130a includes a proximal end defining a first aperture 140 and a distal end defining a second aperture 150a. The second channel 130b includes a proximal end defining a common first aperture 140 and a distal end defining a third aperture 150b. A septum 160 is formed at the distal end between the first and second channels 130a, 130b and their respective distal apertures 150a, 150b.

Figure 6:
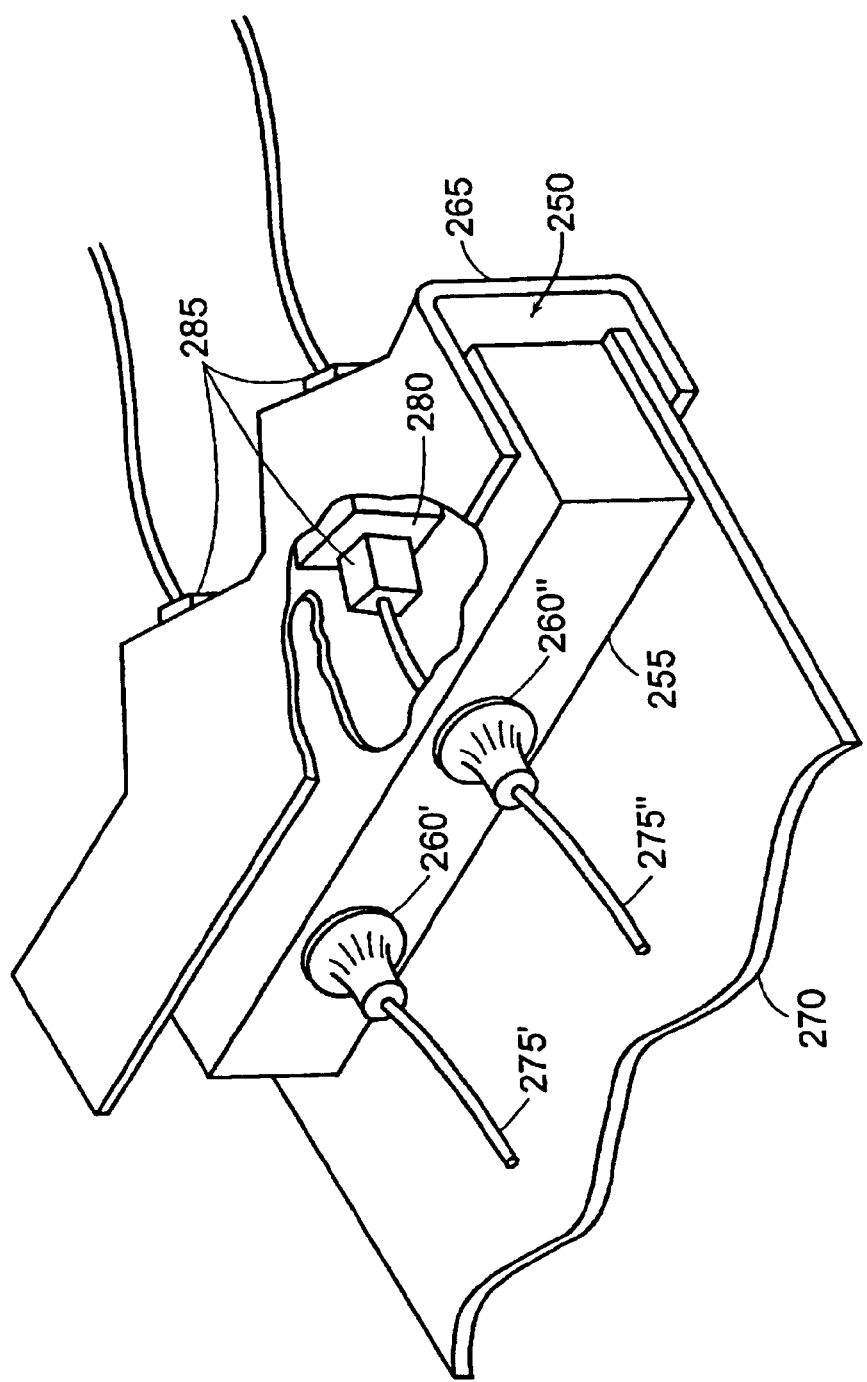
FIG. 6 is a perspective view of one embodiment of an internal, rear-mounted shielding enclosure for shielding a circuit module from EMI emissions.
Figure 7:
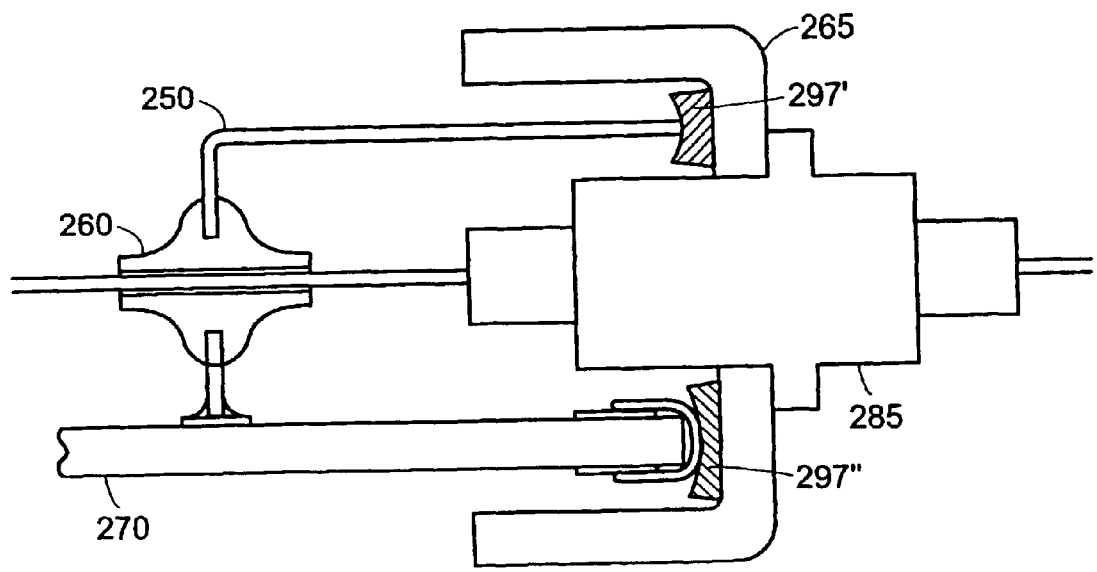
FIG. 7 is a cross-sectional side view of the shielding enclosure according to the embodiment shown in FIG. 6.
Figure 9:
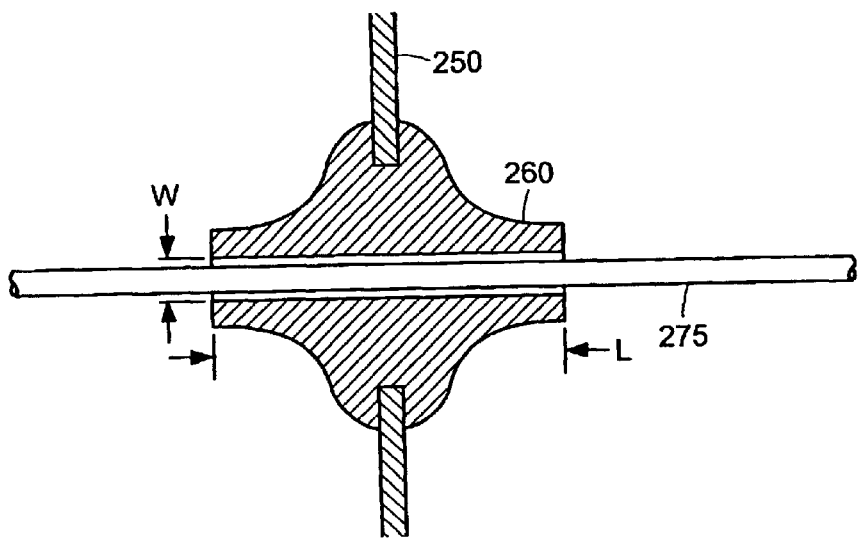
FIG. 9 is a cross-sectional side view of a conductive shielding grommet used in the internal shielding enclosure illustrated in FIGS. 6 and 7.

Referring to FIGS. 6 and 7, shown is one embodiment of a rear-mounted, internal shielding device 250 in accordance with the teachings of the present invention. The internal shielding device 250 includes a conductive shielding element 255 and at least one conformable shielding element 260', 260", generally 260. The conductive shielding element 255 or enclosure is built behind a faceplate 265 covering a circuit module 270, illustrated in partial cut away. The conformable shielding element 260 used in the embodiments illustrated in FIGS. 6, 7, and 9 is a waveguide grommet 260 formed from a conformable member, such as a conductive elastomer. Such conformable waveguide grommets 260 can be used to control the transmission of EMI through apertures within the enclosure 250. Here, the apertures, concealed by the grommets 260, are intended for passing fiber optic cables 275', 275", generally 275, therethrough. In this embodiment, the conductive shielding enclosure 250 becomes the EMI barrier. EMI passing through apertures 280 for one or more bulkhead connectors 285 in the faceplate 265 is reflected or contained by the enclosure 250.

The enclosure 250 can be fabricated from a conductive material, such as a metal, e.g., copper, or aluminum; or from a metal compound, e.g., nickel coated copper; or from a nonconductive, or dielectric substrate, e.g., a polymer, coated with an electrically conductive layer. Typically, the faceplate 265 is also constructed from a conductive material as described above, that may be the same or different than the conductive material selected for the enclosure 250.

FIG. 7, illustrates a cross-sectional view of the embodiment illustrated in FIG. 6. As depicted, the enclosure 250 is typically in electrical communication with the faceplate 265 for effective shielding. Generally, any gaps should be avoided along the seams between the enclosure 250 and the faceplate 265, between the enclosure and the circuit module 270, and the circuit module 270 and the faceplate 265. Additionally, these seams should provide a conductive path substantially along their entire extent. To achieve this end, the seams can be lined with a conductive gasket 297', 297", 297''', generally 297. The conductive gasket 297 can be any commercially available EMI gasket, such as wire mesh, conductive elastomer, and conductive coated foam. Alternatively, the enclosure can be welded, soldered, or otherwise electrically attached to the faceplate 265 and or circuit module 270.

The conformable grommet 260, made from a conductive material, such as conductive elastomer, acts as a waveguide beyond cutoff, thereby limiting the transfer of EMI signals to those EMI signal components having a wavelength approximately less than a predetermined cutoff wavelength. EMI signal components having a wavelength that is greater than the cutoff wavelength are substantially attenuated, or reduced in amplitude as a function of the dimensions of the conformable grommet 260.

In general, a waveguide can be defined as a tubular transmission line for selectively transmitting (i.e., propagating) radiated electromagnetic signals of particular wavelengths. Typically the waveguides are hollow tubes having cross-sectional shapes that are circular or polygonal. Accordingly, these waveguides are capable of passing higher frequency (shorter wavelength) electromagnetic signals through a conductive barrier. Such hollow waveguides may also be adapted to pass gasses or fluids, or nonconductive solids, such as fiber optic cables.

Figure 8:
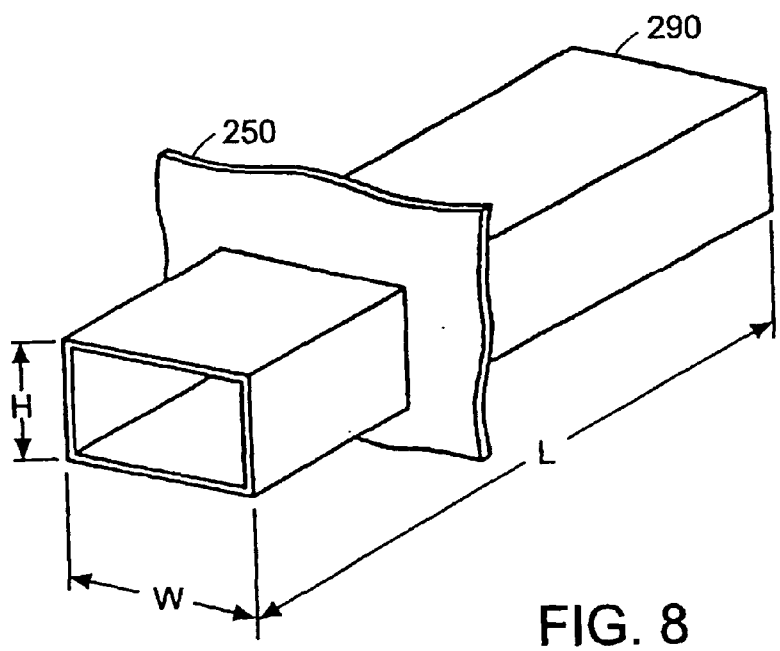
FIG. 8 is a perspective view of a representative rectangular waveguide.

Referring to FIG. 8, shown in perspective view is a representative rectangular waveguide 290 extending through a conductive boundary 250. The rectangular waveguide 290 has a fixed length "L" and a maximum cross-sectional dimension "W", representing the width of the rectangular waveguide 290. The rectangular waveguide 290 also has a height dimension "H"; however, as W is greater than H, W will be the dominant dimension controlling an overall predetermined lowest cutoff wavelength. Electromagnetic waves can be characterized as having one or more frequencies "$f$", typically measured in Hz, and one or more corresponding wavelengths "$\lambda$", typically measured in meters. The frequency of the wave is inversely proportional to wavelength and the relationship between frequency and wavelength is shown in the following equation, wherein the constant "c" is an approximation of the speed of light in a vacuum (i.e., $3 \times 10^8$ meters per second).

$$f = \frac{c}{\lambda} \quad \text{(Equation 1)}$$

As described, the maximum cross-sectional dimension "W" of the waveguide 290 determines the largest wavelength that may pass through the waveguide without significant amplitude loss. For example, when the maximum cross-sectional dimension "W" is larger than one half the wavelength of a signal the waveguide passes suitably polarized signals through the waveguide with a negligible loss in amplitude of the signal. Thus, the waveguide 290 passes EMI signal components having frequencies above a predetermined cutoff frequency, $f_c$, or, equivalently, the waveguide 290 passes EMI signal components having wavelengths below a predetermined cutoff wavelength $\lambda_c$.

More importantly, when the cross-sectional dimension "W" is smaller than a half of a wavelength of the signal, the waveguide 290 imposes an amplitude loss that is significant, and the waveguide is said to be in operation beyond cutoff. The frequency at which cutoff begins is commonly referred to as the cutoff frequency "$f_c$", and is defined as the frequency whose corresponding wavelength "$\lambda$" is twice the maximum cross-sectional dimension ($\lambda_c = 2W$).

In the embodiment shown in FIG. 9, the maximum cross-sectional dimension "W" of a channel defined by the conformable grommet 260 is the diameter of a circle defining the perimeter of aperture 300. The size of the diameter is selected to be less than about one half of the wavelength of the highest frequency EMI emissions generated by electric devices proximate to the enclosure. Thus, EMI emissions generated by electronic devices are attenuated by the conformable grommets, and substantially contained within the enclosure, thereby providing effective EMI shielding.

Referring again to FIG. 10, the shielding effectiveness is also affected by the length "L" of the waveguide 290. Shielding effectiveness of a waveguide beyond cutoff, can be expressed as an attenuation, "A", commonly measured in decibels (dB). A general relationship is provided in equation 2 that approximates the attenuation of a waveguide of a predetermined cross-sectional shape, having a length L and a maximum cross-sectional dimension W.

$$A_{dB} \approx K \frac{L}{W} \sqrt{\left(\frac{\lambda_{EMI}}{\lambda_c}\right)^2 - 1} \quad \text{(Equation 2)}$$

In this equation, K is a geometry dependant constant that has a value of 32 for circular waveguides and a value of 27 for rectangular waveguides, and $\lambda_{EMI}$ is the wavelength of an EMI signal, whereas $\lambda_c$ is equal to twice the length of the maximum cross-sectional dimension "W" (i.e., $\lambda_c = 2W$).

Thus, from equation 2, one can see that attenuation, or shielding effectiveness, is a function of both maximum cross-sectional dimension "W" and a ratio of length to maximum cross-sectional dimension (L/W).

Figure 10:
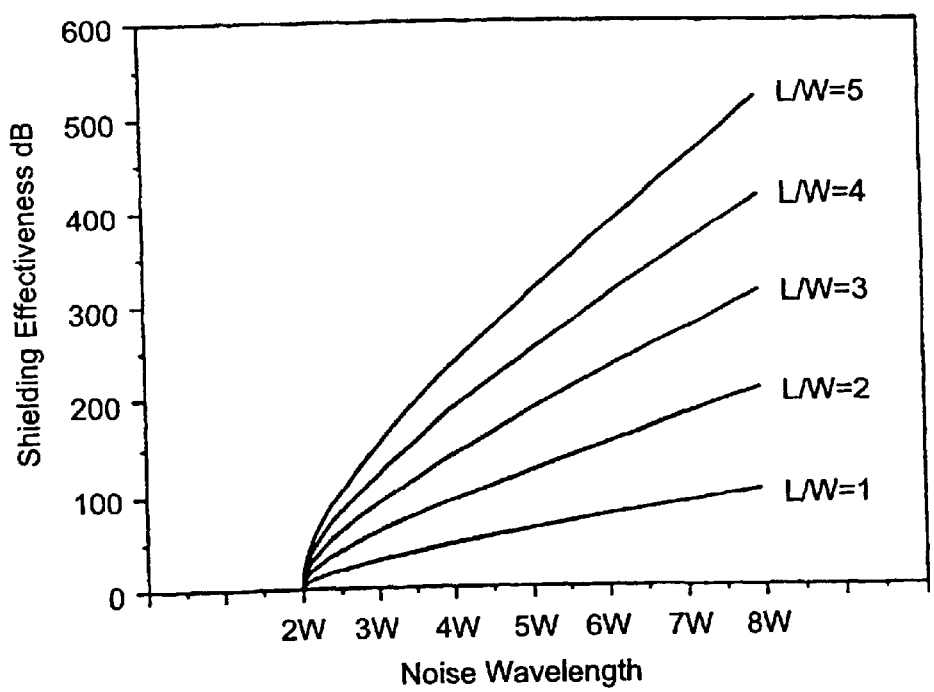
FIG. 10 is plot of shielding effectiveness (measured in decibels ("dB")) versus normalized noise wavelength (dimensionless) for various waveguide configurations.

A graph depicted in FIG. 10 graphically illustrates the relationship between shielding effectiveness, W, and the ratio of L/W for a rectangular waveguide having a width $W \leq \lambda_c/2$. The graph shows that if the wavelength $\lambda_{EMI}$ of the signal is at least about eight or times the maximum cross-sectional dimension "W" of the waveguide, upwards of 100 dB of shielding can be achieved when the length "L" of the waveguide is equal or greater than to the maximum cross-sectional dimension "W".

In many applications, 100 dB of shielding is adequate protection against EMI emissions. Therefore, it is desirable that "W" of the channel in the conformable grommet is be at most one eighth the wavelength of the highest frequency used proximate to the waveguide. In some applications it may not be possible to achieve the desired width, because the cable to be accommodated has a larger diameter. In such situations in which the maximum cross-sectional dimension cannot be made small enough so that "W" is equal to or smaller than one eighth of the signal (noise) wavelength, shielding performance can be improved by increasing the L/W (e.g., increasing the ratio from 1 to 4 at wavelengths above three times "W" will increase the shielding from about 25 dB to over 100 dB). As a general rule, to obtain any non-trivial shielding, the waveguide width should be no larger than half the predetermined cutoff wavelength (i.e., $W \leq \lambda_c/2$).

It is therefore an objective of the invention to provide the smallest opening or aperture 300 to the channel for the passage of fiber optic cables. Another objective is to provide the channel with a relatively large L/W ratio to further attenuate the amplitude of signals to prevent the passage of the signal through the waveguide.

Figure 11:
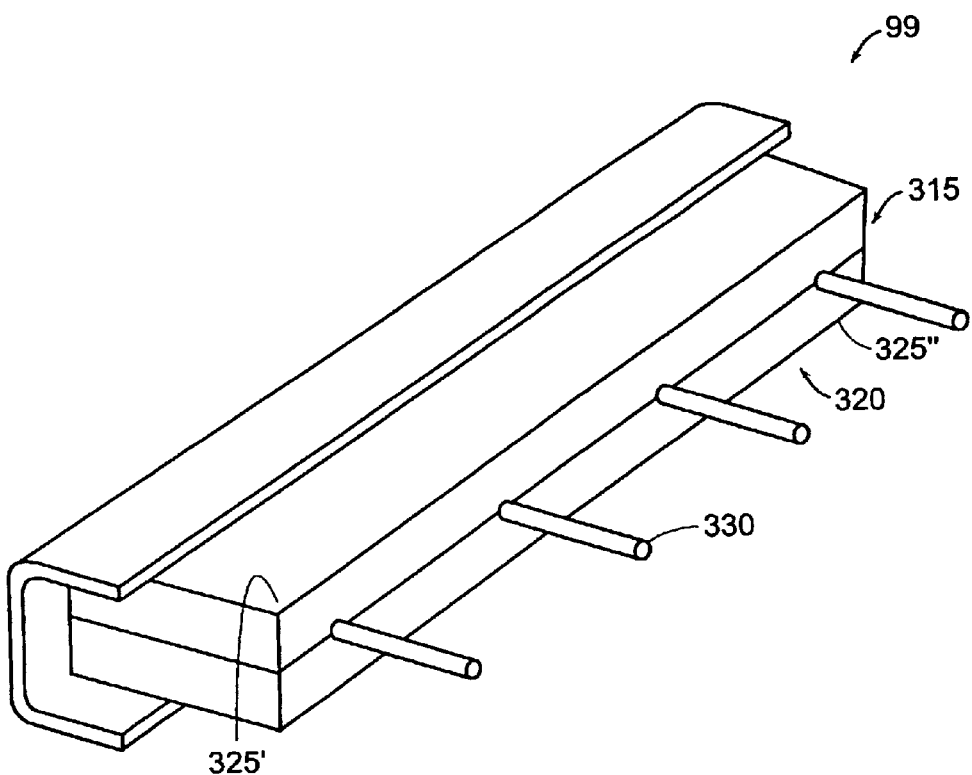
FIG. 11 is a perspective view of an embodiment of a shielding plug for shielding EMI emissions at multiple apertures.
Figure 12A:
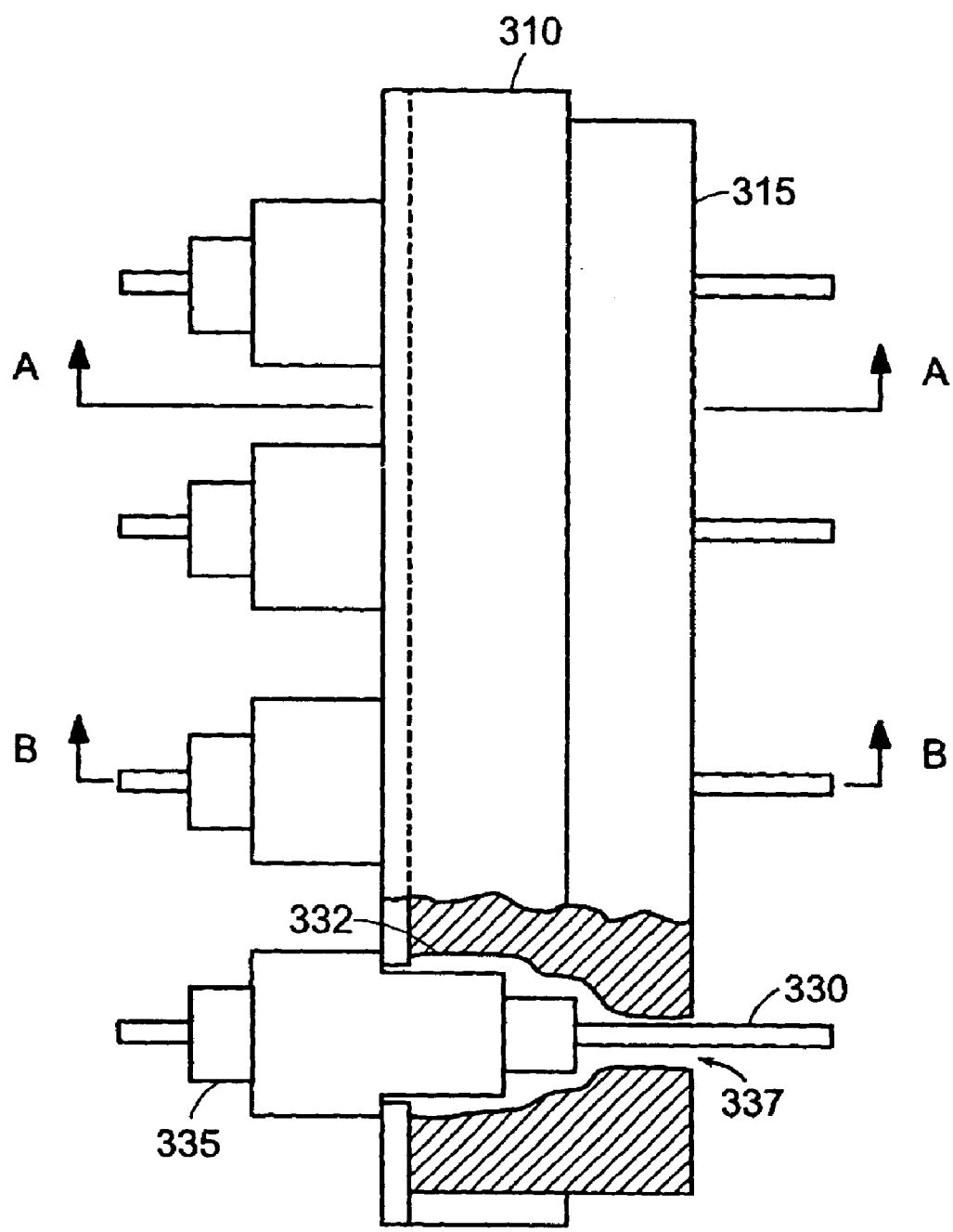
FIG. 12A is a top view of the shielding plug according to the embodiment shown in FIG. 11.
Figure 12B:
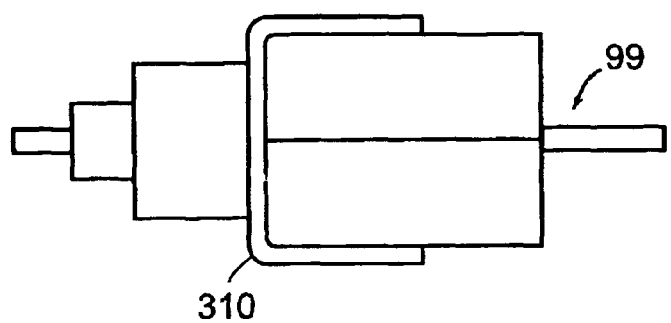
FIG. 12B is a side view of the shielding plug according to the embodiment shown in FIG. 12A.
Figure 12C:
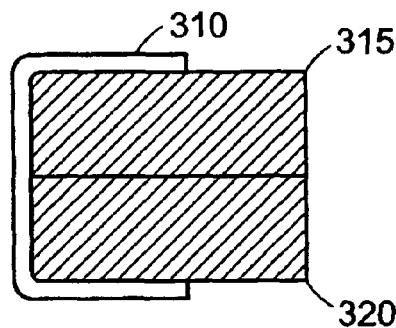
FIG. 12C is a cross-sectional view of the shielding plug taken along line AA in FIG. 12A.
Figure 12D:
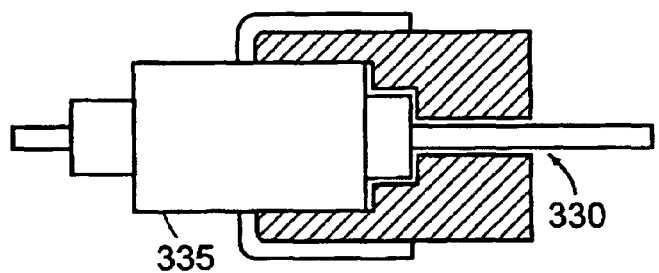
FIG. 12D is a cross-sectional view of the shielding plug taken along line BB in FIG. 12A.

Referring to FIGS. 11–12D shown is another embodiment of a rear-mounted, internal shielding device 99 in accordance with the teachings of the present invention. In this illustrative embodiment, a circuit board is not in close proximity to a front bezel 310. The internal shielding device 99 or plug shown in FIG. 11 includes an upper shielding block 315 (a first conformable element) and a lower shielding block 320 (a second conformable element). The upper and lower shielding blocks 315, 320 are shaped to fit around one or more portions of non-conductive fiber optic cable assemblies. For example, the shielding blocks 315, 320 can be shaped to fit around a cable connector with a fiber optic cable (i.e., a pigtail). The upper and lower shielding blocks 315, 320 have respective conductive external surfaces 325', 325". The conductive external surfaces 325', 325" can be made from a conductive or conductively coated elastomer foam, such as Electro-Coat material, available from Laird Technologies, Inc., located in Delaware Water Gap, Pa. The upper and lower shielding blocks 315, providing at least one channel terminating in an aperture, or waveguide opening having a maximum cross-sectional dimension "W" to accommodate a fiber optic cable 330.

FIG. 12A shows a top view and FIG. 12B shows a side or end view of the embodiment of the internal shielding plug 99 of FIG. 11. As shown in the cut-away section of FIG. 12A, the upper block 315 has an aperture 332' for receiving a portion of a non-conductive, bulkhead connector 335, and a channel 337' for receiving the fiber optic cable 330. The lower block 320, not shown in FIG. 12A, also has a similar aperture 332" and channel 337", that mate with the aperture 332' and channel 337' of the upper block 315. Both the upper and lower blocks 315, 320 are made from a conformable material, that allows the upper and lower blocks 315, 320 to accept and shield different sized connectors 336 and fiber-optic cables 330 without modification.

FIGS. 12C and 12D illustrate in horizontal cross-sectional views of the internal shielding plug 99. The cross-sectional view shown in FIG. 12C is taken along line AA in FIG. 12A showing a portion of the shielding plug 99 between two adjacent connectors. In this view, a portion of the outer surface of upper and lower blocks 315, 320 is in electrical contact with an surface of the bezel 310. Additionally, mating surfaces of each of the upper and lower blocks 315, 320 are in electrical contact with the bezel 310 as well as with each other. The cross-sectional view of the shielding plug shown in FIG. 12D is taken along line BB in FIG. 12A. This view shows the upper and lower blocks 315, 320 around a connector. In the embodiment shown in FIG. 12D, clearance exists around the connector 335 and around the fiber optic cable 330. In other embodiments, not shown, there may be little or substantially no clearance around either the connector 335 or the cable 330. As the blocks 315, 320 are conformable, they can also be compliant and resilient, such that the blocks 315, 320 adapt to the form of the connector 335 and cable 330, thereby providing a snug fit about either or both of the connector 335 and/or the cable 330. Notably, the maximum cross-sectional dimension (e.g., diameter) of a channel adapted for accommodating both a connector and a cable can include a channel having multiple diameters, the channel extending for each of the multiple diameters, a respective length. To determine an estimate of the overall shielding effectiveness, equation 2 can be separately applied to each of the different diameter segments. Generally, the largest dimension of the smallest diameter section will control the cutoff wavelength and contribute to the attenuation, unless the length of that section is relatively short.

The channel 332 for the fiber optic cable in the upper and lower blocks has a length that is typically much longer than the maximum cross-sectional dimension "W". The channel for the cable 330 acts as a waveguide beyond cutoff, limiting the amplitude of EMI signals passed through the channel 332 in the shielding plug 99. To create a waveguide beyond cutoff, the maximum cross-sectional dimension "W" of the channel 332 is less than or equal to about one half the wavelength corresponding to the highest frequency generated by an electronic device proximate to the shield 99. In some embodiments, the maximum cross-sectional dimension "W" is one eighth the value of the wavelength corresponding to the highest frequency generated by the electronic device. The channel 332 has a L/W ratio value greater than or equal to one. In some embodiments, the channel has a L/W ratio value of two. In other embodiments, the channel has a L/W ratio value of five or more.

Access to the bulkhead connectors 335 at the rear of the bezel 310 can be obtained by removing one or both shielding blocks 315, 320. Once the blocks 315, 320 are installed within a circuit module, the upper and lower blocks 315, 320 are held in place primarily by friction. Alternatively or additionally, suitable clips, straps, or the like can be used to apply clamping or retention forces to hold the upper and lower blocks 315, 320 in place. Also, as described with reference to FIG. 4A, a chemical means, such as a glue, can be used to hold the upper and lower blocks 315, 320 in place.

Figure 13:
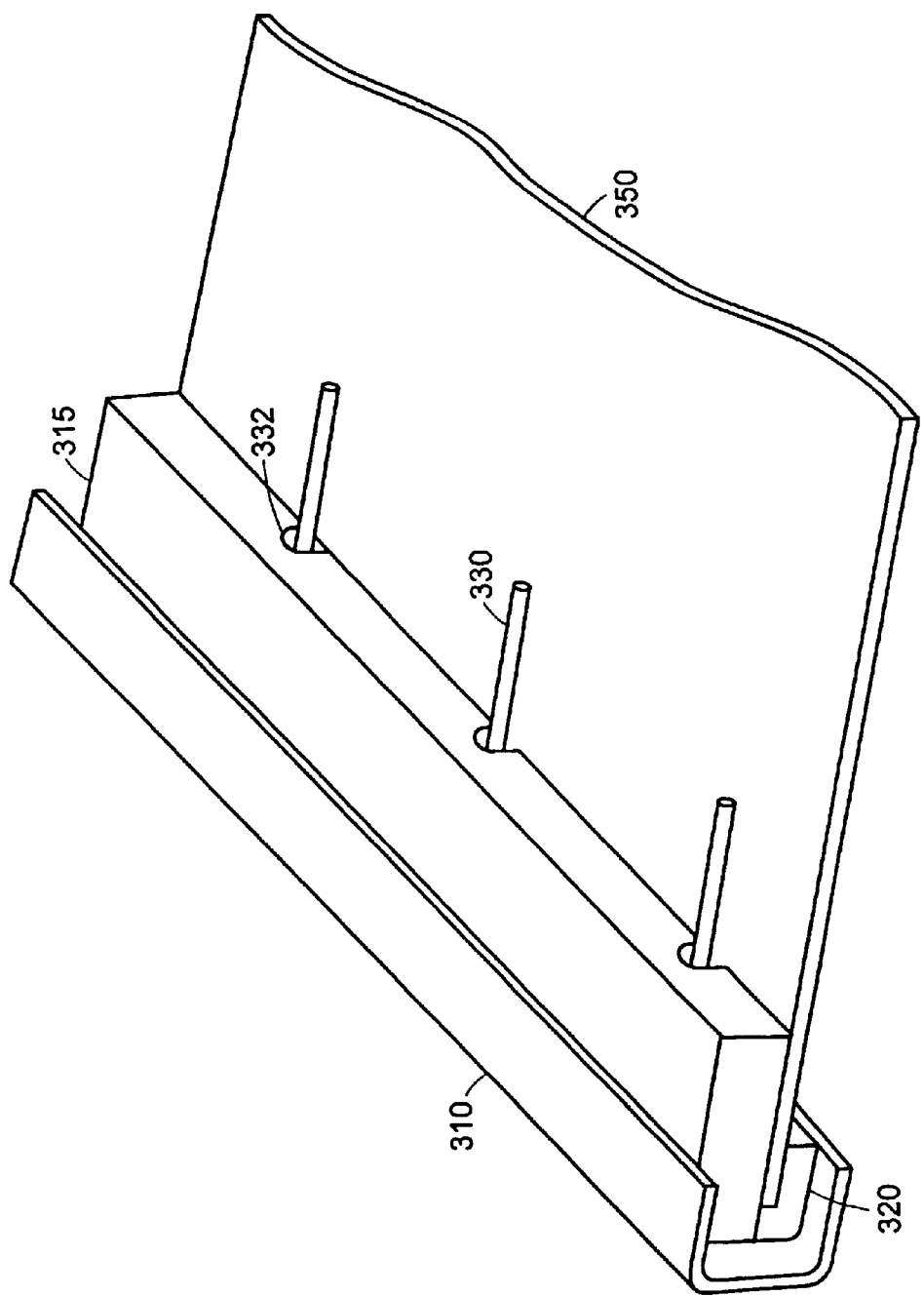
FIG. 13 is a perspective view of another embodiment of a shielding plug.
Figure 14A:
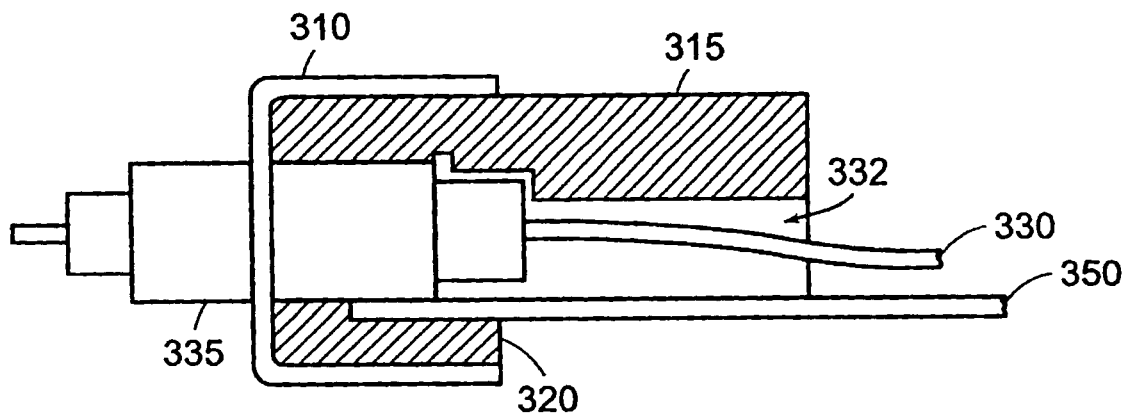
FIG. 14A is a horizontal cross-sectional view of a portion of the shielding plug in FIG. 13 enclosing a bulkhead connector.
Figure 14B:
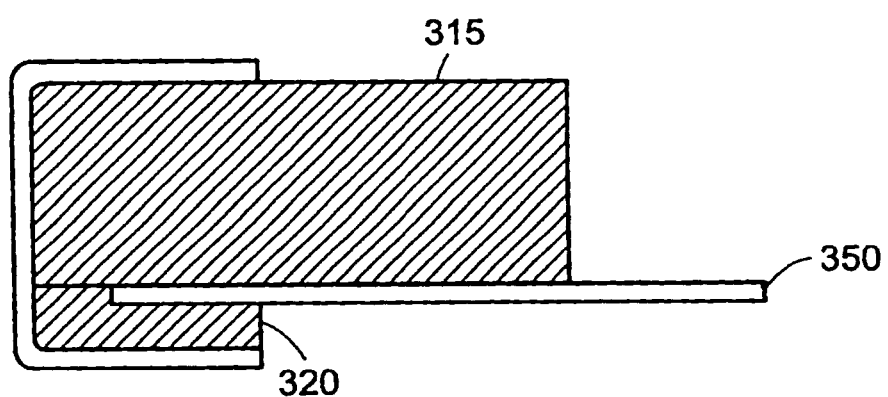
FIG. 14B is a horizontal cross-sectional view of a portion of the shielding plug in FIGS. 13 and 14A between two adjacent bulkhead connectors.

Referring to FIGS. 13–14B shown is another embodiment of a rear-mounted, internal shielding plug 99 in accordance with the teachings of the present invention. In this illustrative embodiment, a circuit board 350, illustrated in partial cut-away, is disposed in close proximity to a front bezel 310. This embodiment is similar to the embodiment illustrated in FIGS. 11–12D; however, because the circuit board 350 is in close proximity to the bezel 310, the channel 332 for the fiber optic cable 330 can be formed advantageously between the upper block 315 and the circuit board 350. Consequently, a width of the lower block 320 does not need to be as large as a width of the upper block 315, as the lower block 320 is not being used to form a waveguide for limiting EMI emissions, as is the upper block 315. FIG. 13 illustrates a perspective view of the internal shielding block 99 surrounding the circuit board 350. FIGS. 14A and 14B show horizontal cross-sectional views of a portion of the shielding plug 99. FIG. 14A shows a portion of the shielding plug around connector 335 and FIG. 14B shows a portion of the shielding plug 99 between adjacent connectors 335.

The embodiment shown in FIGS. 13–14B may further include a conductive plane, such as a grounding layer, or pad, on top and/or bottom surfaces of the circuit board 350, so that the circuit board 350 can mate and be in electrical communication with either or both the upper and lower conductive shielding blocks 315, 320.

Figure 15:
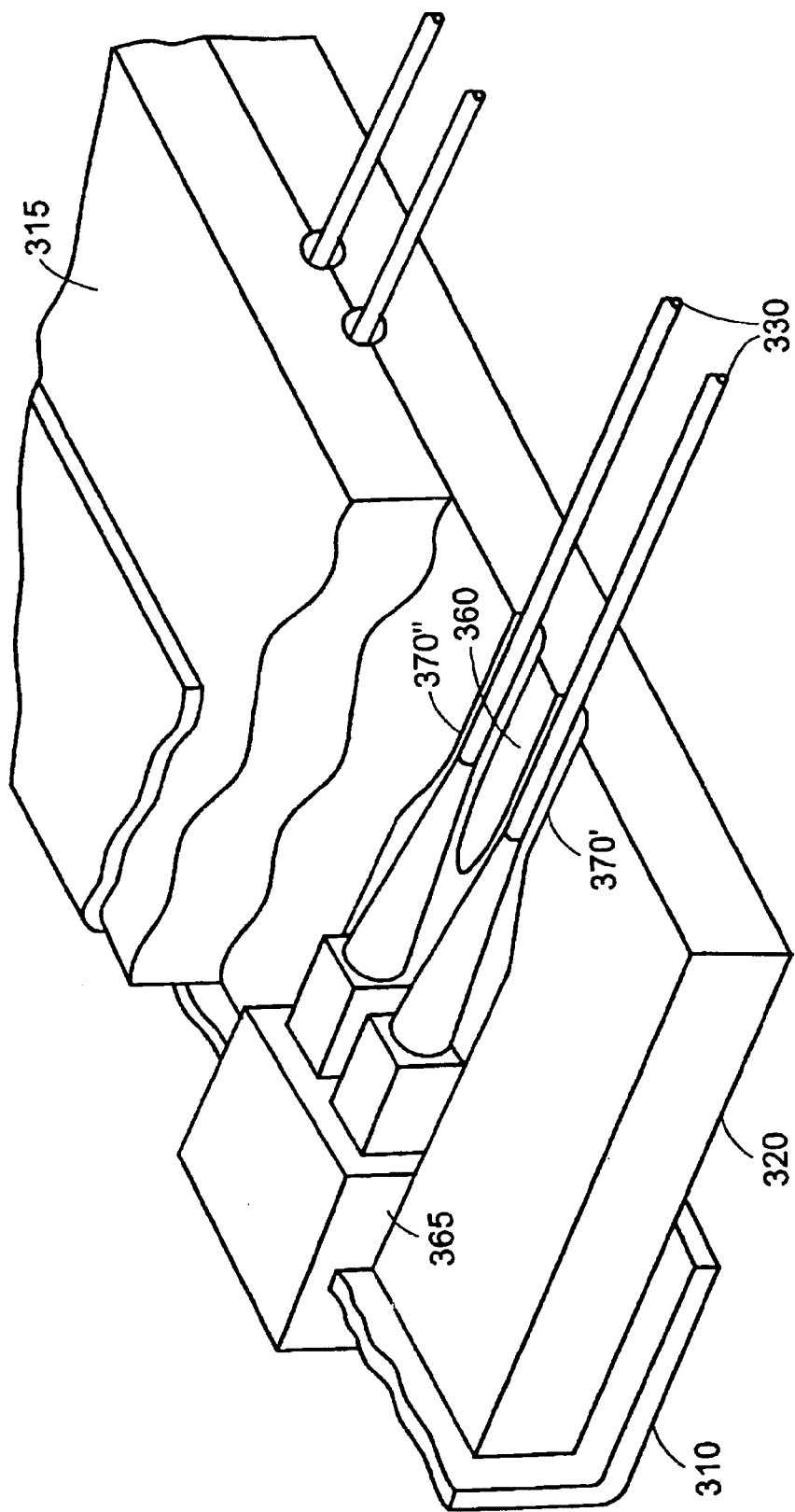
FIG. 15 is a perspective view in partial cut-away of a shielding plug according to the invention adapted to receive a duplex bulkhead connector and cables.

In conventional shielding plugs, a problem exists when providing shielding about a duplex fiber optic device. A duplex fiber optic device is a device which has two fiber optic cables extending from one bulkhead connector. Another advantage of the shielding plug of the present invention is the ability of the shielding blocks to be adapted to support and provide sufficient shielding protection for a duplex fiber optic device. As discussed above, it is generally preferable to have the smallest aperture or opening to a channel within shielding blocks to provide the most effective shielding. FIG. 15 shows a representative embodiment of a shielding plug of the invention adapted to accommodate duplex fiber optic devices. To provide the smallest maximum cross-sectional dimension according to the invention, the shielding plug can be adapted to include a septum 360 dividing an otherwise large channel 365 into two smaller channels 370', 370".

Figure 16:
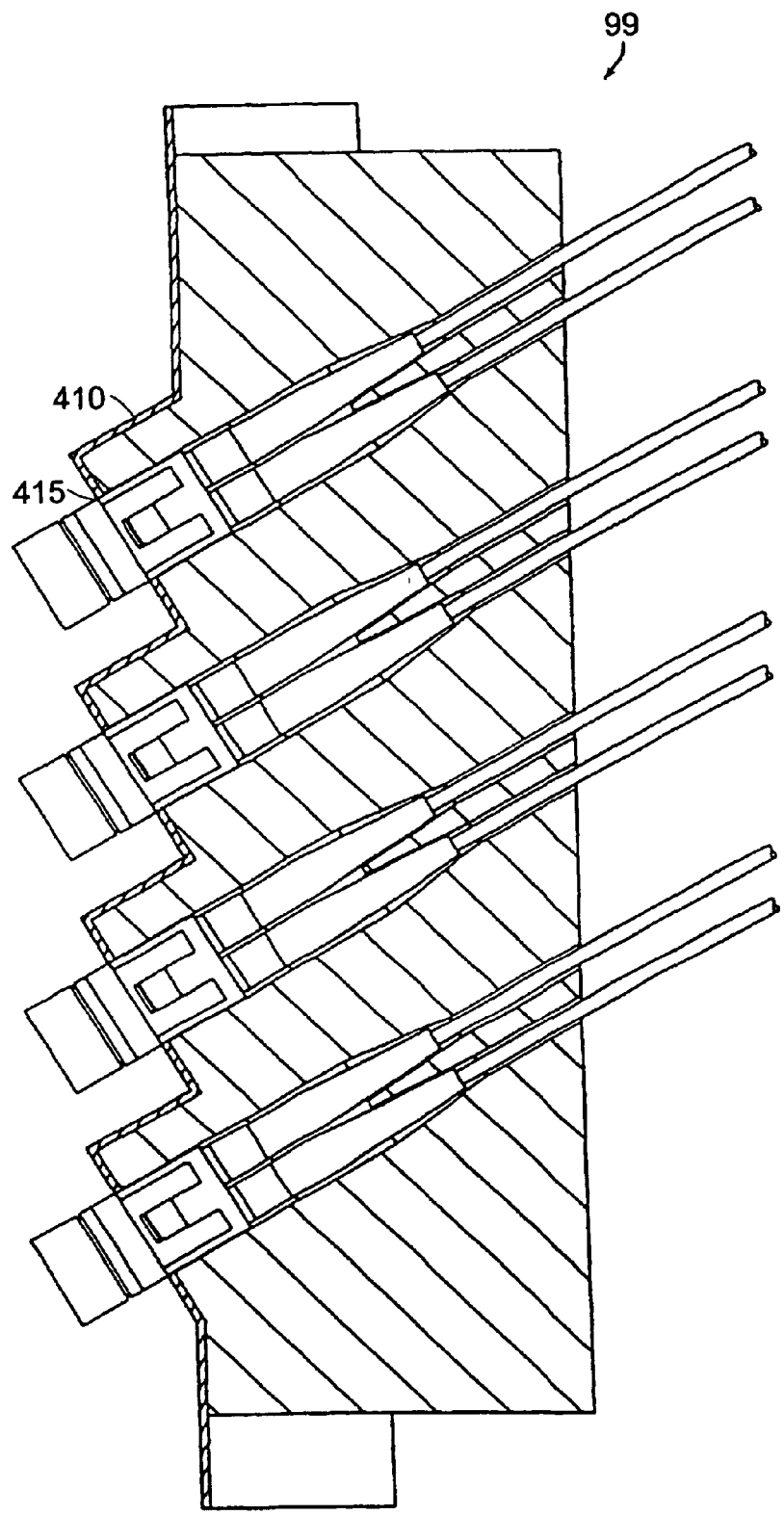
FIG. 16 is a vertical cross-sectional top view of an embodiment of a shielding plug used multiple bulkhead connectors penetrating through an angled bezel.
Figure 17:
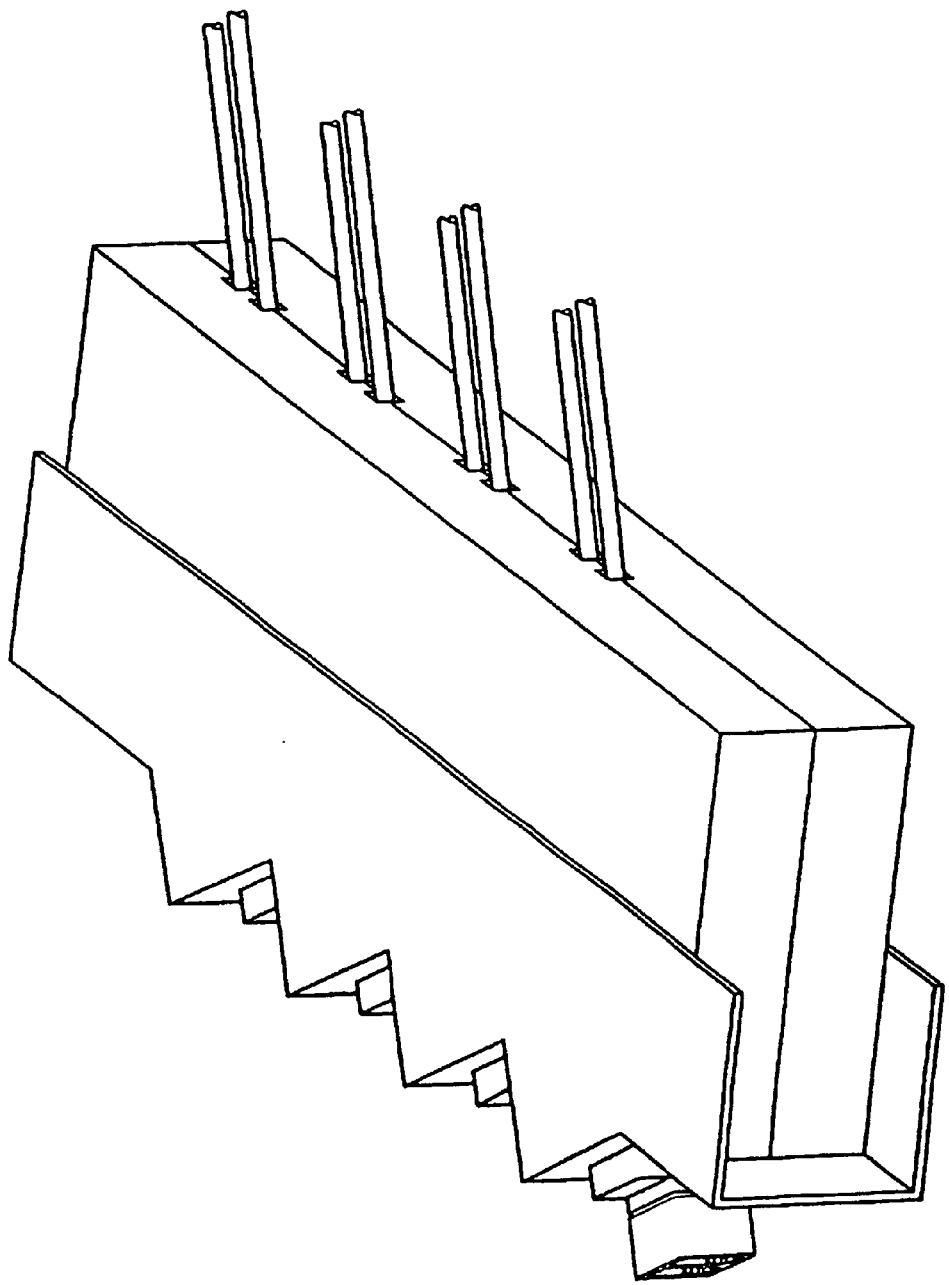
FIG. 17 is a perspective view of the embodiment of the shielding plug of FIG. 16.

Fiber optic connectors in networked systems are often placed at an angle, when penetrating the front bezel. FIGS. 16–17 show different views of a system with an angled bezel 410 and components thereof. Angled bezels 410 can have a sawtooth profile on the rear of the bezel 410. One of the advantages of the internal shielding plug 99 of the present invention is that a conformable upper block (not shown) can be manufactured to mate with an irregular bezel surface having angled connection ports. The shielding plug 99 illustrated in FIGS. 16–17 is adapted to conform, by way of example, to an angled faceplate having multiple connection ports 415.

Variations, modifications, and other implementations of what is described herein will occur to those of ordinary skill in the art without departing from the spirit and the scope of the invention as claimed. The various features and configurations shown and equivalents thereof can be used in various combinations and permutations. Accordingly, the invention is to be defined not by the preceding illustrative descriptions, but instead by the following claims.

What is claimed is:

1. An apparatus for reducing a transfer of electromagnetic interference (EMI) across a conductive boundary defining an aperture in a structure, the apparatus comprising:

a conformable member comprising:

a conductive external surface along at least a portion thereof, the conductive external surface being in electrical communication with a conductive boundary defining an aperture in a structure when installed therein; and a first conductive channel defined by the conformable member extending therethrough, the first conductive channel having a predetermined minimum length, being adapted for receiving at least a portion of a cable assembly, and being in electrical communication with the conductive external surface, the first conductive channel forming:

a first aperture at a proximal end of the channel; and a second aperture at a distal end of the channel, the second aperture having a predetermined maximum cross-sectional dimension less than about one half of a predetermined cut-off wavelength, wherein the maximum cross-sectional dimension and the minimum length determine an attenuation value relating to the transfer of EMI therethrough.

2. The apparatus of claim 1, wherein the conformable member further comprises a proximal end adapted to contact a support element of the structure when installed therein.

3. The apparatus of claim 1, wherein the first conductive channel comprises a bore.

4. The apparatus of claim 1, wherein the first conductive channel comprises a groove.

5. The apparatus of claim 4, further comprising a conductive member, the conductive member and the groove forming, when mated, a bore.

6. The apparatus of claim 1, wherein the conformable member comprises a first conformable element and a second conformable element, the first and second conformable elements forming, when mated, a conductive bore extending therethrough.

7. The apparatus of claim 1, wherein the conformable member comprises conductive flexible polymeric material.

8. The apparatus of claim 1, wherein the conformable member comprises flexible polymeric material including a conductive coating.

9. The apparatus of claim 1, wherein the conformable member further defines a second conductive channel having a third aperture at a proximal end and a fourth aperture at a distal end, the fourth aperture having a predetermined maximum cross-sectional dimension less than about one half of a predetermined cut-off wavelength, each conductive channel being adapted for receiving at least a respective portion of a cable assembly.

10. The apparatus of claim 9, wherein the first aperture and the third aperture comprise a common aperture.

11. The apparatus of claim 1, wherein the conformable member is adapted to mate with a portion of a circuit board.

12. The apparatus of claim 1, further comprising an electrically conductive flange having:

a first surface in electrical communication with the conformable member, the first surface being adapted for slideably engaging the conformable member; and a second surface in electrical communication with the boundary, the second surface being fixedly attached to the conductive boundary.

13. The apparatus of claim 1, wherein the conductive member is disposed on a first side of the aperture defined by the conductive boundary.

14. The apparatus of claim 1, wherein the conductive member comprises a grommet, at least a portion of which extends through the aperture defined by the conductive boundary.

15. The apparatus of claim 2, wherein the proximal end of the conformable element is adapted to conform to an angled surface.

16. The apparatus of claim 1, wherein the minimum length is at least two times greater than the maximum cross-sectional dimension of the first conductive channel.

17. The apparatus of claim 1, wherein the maximum cross-sectional dimension is less than about one-eighth of the cut-off wavelength.

18. A method for reducing a transfer of electromagnetic interference (EMI) across a conductive boundary defining an aperture in a structure, the apparatus comprising:

providing a conformable member comprising:

a conductive external surface along at least a portion thereof, the conductive external surface being in electrical communication with a conductive boundary defining an aperture in a structure when installed therein; and a first conductive channel defined by the conformable member extending therethrough, the first conductive channel having a predetermined minimum length, being adapted for receiving at least a portion of a cable assembly, and being in electrical communication with the conductive external surface, the first conductive channel forming:

a first aperture at a proximal end of the channel; and a second aperture at a distal end of the channel, the second aperture having a predetermined maximum cross-sectional dimension less than about one half of a predetermined cut-off wavelength, wherein the maximum cross-sectional dimension and the minimum length of the first conductive channel determine an attenuation value relating to the transfer of EMI therethrough; and installing the conformable member in the structure.

19. The method of claim 18, further comprising adapting a proximal end of the conformal member to contact a support element of the structure when installed therein.

20. The method of claim 18, further comprising providing a conductive member, the conductive member and the channel forming, when mated, a bore.

21. The method of claim 18, wherein providing a conformable member comprises providing a first conformable element and a second conformable element, the first and second conformable elements forming, when mated, a conductive bore extending therethrough.

22. The method of claim 18, wherein providing a conformable member comprises providing conductive flexible polymeric material.

23. The method of claim 18, wherein providing a conformable member comprises providing flexible polymeric material including a conductive coating.

24. The method of claim 18, further comprising adapting the conformable member to mate with a portion of a circuit board.

25. The method of claim 18, further comprises adapting the conductive member to function as a grommet, at least a portion of the conductive member extending through the aperture defined by the conductive boundary.

26. The method of claim 18, further comprising adapting the proximal end of the conformable element to conform to an angled surface.

27. The method of claim 18, wherein the minimum length is at least two times greater than the maximum cross-sectional dimension of the first conductive channel.

28. The method of claim 18, wherein the maximum cross-sectional dimension is less than about one-eighth of the predetermined cut-off wavelength.

29. A device for shielding EMI, the device comprising:

a conductive element forming an aperture adapted to receive a cable, the conductive element, comprising:

a first end including a conductive gasket adapted to contact a support structure; and a second end including a conductive gasket adapted to contact a circuit board; and a conformable element positioned partially within the aperture and adapted to receive the cable, the conformable element forming a channel extending therethrough and forming a waveguide having an aperture with a maximum cross-sectional dimension less than about one half of a predetermined cut-off wavelength, wherein the waveguide attenuates EMI signals having a wavelength greater than the cut-off wavelength.

* * * * *